(12) United States Patent
Masters et al.

(10) Patent No.: US 6,674,222 B2
(45) Date of Patent: Jan. 6, 2004

(54) SINGLE CRYSTAL PIEZOELECTRIC TRANSFORMER

(75) Inventors: Brett Masters, Belmont, MA (US);
Brian MacLachlan, Malden, MA (US)

(73) Assignee: Mide Technology Corporation, Medford, MA (US)

(*) Notice: Subject to any disclaimer, the term of this patent is extended or adjusted under 35 U.S.C. 154(b) by 0 days.

(21) Appl. No.: 10/117,568

(22) Filed: Apr. 5, 2002

(65) Prior Publication Data

US 2003/0062808 A1 Apr. 3, 2003

Related U.S. Application Data

(60) Provisional application No. 60/281,917, filed on Apr. 5, 2001.

(51) Int. Cl.[7] ............................................. H01L 41/08
(52) U.S. Cl. ............................................................ 310/359
(58) Field of Search ................................... 310/358, 359

(56) References Cited

U.S. PATENT DOCUMENTS

| | | | |
|---|---|---|---|
| 2,974,296 A | 3/1961 | Rosen | 310/359 |
| 5,118,982 A | 6/1992 | Inoue et al. | 310/366 |
| 5,229,680 A | 7/1993 | Sato et al. | 310/339 |
| 5,241,236 A | 8/1993 | Sasaki et al. | 310/358 |
| 5,278,471 A | 1/1994 | Uehara et al. | 310/328 |
| 5,341,061 A | 8/1994 | Zaitsu | 310/318 |
| 5,402,031 A | 3/1995 | Tagami et al. | 310/359 |
| 5,424,602 A | 6/1995 | Sato et al. | 310/359 |
| 5,504,384 A | 4/1996 | Lee et al. | 310/359 |
| 5,594,292 A * | 1/1997 | Takeuchi et al. | 310/324 |
| 5,675,208 A | 10/1997 | Huang et al. | 310/360 |
| 5,757,106 A | 5/1998 | Sato et al. | 310/359 |
| 5,804,907 A * | 9/1998 | Park et al. | 310/358 |
| 5,814,922 A | 9/1998 | Uchino et al. | 310/359 |
| 5,834,882 A | 11/1998 | Bishop | 310/359 |
| 5,852,337 A * | 12/1998 | Takeuchi et al. | 310/328 |
| 5,872,419 A | 2/1999 | Hall et al. | 310/359 |
| 5,894,185 A | 4/1999 | Asada et al. | 310/368 |
| 6,114,797 A | 9/2000 | Bishop et al. | 310/318 |
| 6,215,227 B1 | 4/2001 | Boyd | 310/328 |
| 6,278,227 B1 | 8/2001 | Katsuno et al. | 310/359 |
| 6,434,028 B1 * | 8/2002 | Takeuchi et al. | 363/59 |

* cited by examiner

*Primary Examiner*—Thomas M. Dougherty
(74) *Attorney, Agent, or Firm*—Choate, Hall & Stewart

(57) ABSTRACT

The present invention comprises a piezoelectric transformer having substantially improved performance. The piezoelectric element is composed of a single crystal of a relaxor ferroelectric piezoelectric material. This element is coupled to input and output electrodes. The element vibrates mechanically in response to an input signal, which causes an output signal to be generated at the output electrodes. Improved power transmission is observed despite the reduced mechanical Q of the single crystal material, because the coupling and dielectric strength of the material are improved relative to polycrystals.

7 Claims, 4 Drawing Sheets

SINGLE CRYSTAL PIEZOELECTRIC TRANSFORMER

This application claims benefit of priority from U.S. Provisional Application No. 60/281,917, filed Apr. 5, 2001, which is incorporated herein by reference. It further is related to and incorporates by reference the commonly-owned application being filed on even date herewith, "Tuned Power Ignition System," by Masters et al.

FIELD OF THE INVENTION

The present invention relates to piezoelectric transformers, and in particular to a transformer comprising a single crystal piezoelectric material.

BACKGROUND OF THE INVENTION

Piezoelectric transformers have been known for many years, and are described, for example, in U.S. Pat. No. 2,974,296 to C. A. Rosen. These transformers use mechanical resonance of a piezoelectric element to transform current and voltage. An input current is passed through the element, causing it to vibrate at a resonant frequency. Electrodes are attached to the element at different points from the input electrodes, thereby producing a transformed output current in response to the mechanical deformation.

Piezoelectric transformers offer a unique method of step-up and step-down voltage conversion as compared to traditional coil-based electromagnetic transformers. Piezoelectric transformers offer higher voltage gains while retaining significant current throughput in applications where a large number of coil windings and low output amperages become impractical. They operate efficiently (upwards of 90%) in a narrow frequency band (the mechanical resonant frequency), while electromagnetic transformers tend to have lower efficiencies but to operate at a broad range of frequencies.

Prior art in the area of piezoelectric transformers has focused on high mechanical Q materials to increase the voltage transmission of energy. Lower Q devices, using softer polycrystalline materials, are possible, but generally fail because they cannot support high power levels without overheating. U.S. Pat. No. 6,114,797 to Bishop et al. has proposed a combination of hard (input side) and soft (output side) materials to achieve high power throughput with lower voltage gains.

SUMMARY OF THE INVENTION

The present invention comprises a piezoelectric transformer having substantially improved performance. The piezoelectric element is composed of a single crystal of a relaxor ferroelectric piezoelectric material. This element is coupled to input and output electrodes. The element vibrates mechanically in response to an input signal, which causes an output signal to be generated at the output electrodes. Improved power transmission is observed despite the reduced mechanical Q of the single crystal material, because the coupling and dielectric strength of the material are improved relative to polycrystals.

BRIEF DESCRIPTION OF THE DRAWING

The invention is described with reference to the several figures of the drawing, in which.

DETAILED DESCRIPTION

Figure 1:
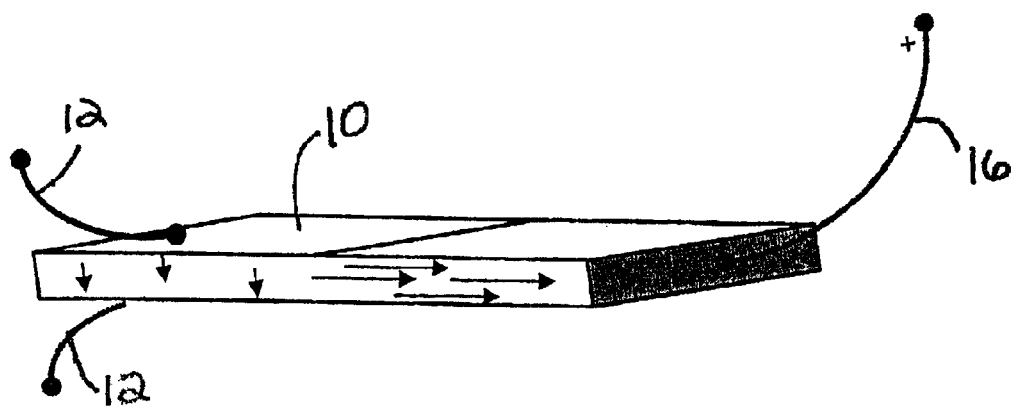
FIG. 1 shows a basic Rosen-type piezoelectric transformer according to the invention.

We have discovered that a remarkable improvement in the performance of a piezoelectric transformer can be achieved when the piezoelectric element is formed from a single crystal of a relaxor ferroelectric material. Rosen-type transformers according to the invention have demonstrated five to six times the output power density of standard polycrystalline equivalents. Generally, any of the various shapes and configurations of transformers developed since Rosen (e.g., a multi-layer Rosen-type transformer as described in U.S. Pat. No. 5,872,419, a single layer or multi-layer thickness mode vibration transformer as described in U.S. Pat. No. 5,341,061, or a high displacement bending type as described in U.S. Pat. No. 6,114,797) may be improved by use of single crystal material. However, the material must be cut and electroded appropriately to take advantage of its higher piezoelectric coupling coefficients and more strongly coupled mechanical properties.

Relaxor piezoelectric materials include, for example, $Pb(Zr_{1-x}Nb_x)O_3$—$PbTiO_3$ (PZN-PT) and $Pb(Mg_{1-x}Nb_x)O_3$—$PbTiO_3$ (PMN-PT), and are described in detail in Park & Shrout, "Characteristics of Relaxor-Based Piezoelectric Single Crystals for Ultrasonic Transducers," *IEEE Trans. on Ultrasonics, Ferroelect. and Freq. Control*, 44(5):1140–1147 (September 1997), which is incorporated herein by reference. To illustrate the difference between polycrystalline and single crystal piezoelectric material, Tables 1 and 2 list selected characteristics of each for some PZN-PT compositions. Note the generally higher coupling coefficients of single crystal material, and the highly coupled compliance and modulus (as evidenced by the ratio of the 13 terms to the 33 terms). Table 2 shows that the mechanical Q of the single crystal material is not as good as the electrical Q, and comparatively not as good as hard polycrystalline piezoelectric material. It also shows that the dielectric strengths can be much higher than hard materials.

TABLE 1

Properties of selected piezo electric materials

| Material | Strain-field coupling, $d_{33}$, $d_{31}$ (pm/V) | Charge-strain coupling, $g_{33}$, $g_{31}$ (mV-m/N) | Coupling coefficient, $k_{33}$, $k_{31}$ | Short-circuit modulus, $c^E_{33}$, $c^E_{11}$, $c^E_{12}$, $c^E_{13}$ ($\times 10^{10}$ N/m²) | Short-circuit compliance, $s^E_{33}$, $s^E_{11}$, $s^E_{12}$, $s^E_{13}$ ($\times 10^{-12}$ N/m²) |
|---|---|---|---|---|---|
| PZT-4* | 289, −123 | 26, −11 | 0.70, −0.33 | 11.5, 13.9, 7.8, 7.4 | 15.5, 12.3, −4.0, −5.3 |
| PZT-5H* | 593, −274 | 20, −9 | 0.75, −0.39 | 11.7, 12.6, 8.0, 8.4 | 20.7, 16.5, −4.8, −8.4 |

TABLE 1-continued

Properties of selected piezo electric materials

| Material | Strain-field coupling, $d_{33}$, $d_{31}$ (pm/V) | Charge-strain coupling, $g_{33}$, $g_{31}$ (mV-m/N) | Coupling coefficient, $k_{33}$, $k_{31}$ | Short-circuit modulus, $c^E_{33}$, $c^E_{11}$, $c^E_{12}$, $c^E_{13}$ (x10$^{10}$ N/m$^2$) | Short-circuit compliance, $s^E_{33}$, $s^E_{11}$, $s^E_{12}$, $s^E_{13}$ (x10$^{-12}$ N/m$^2$) |
|---|---|---|---|---|---|
| Single Crystal# | 2000, −1000 | 44, −21 | 0.91, −0.50 | 10.5, 11.1, 10.1, 10.5 | 108.0, 82.0, −28.5, −51.0 |

Notation is standard IEEE notation for piezoelectricity. Material is transversely isotropic. Cut quoted by manufacturer is <100>.
*data according to Morgan Matroc, Inc. TP-226
data according to TRS Ceramics for PZN-4.5%PT, Inc. http://www.trsceramics.com

TABLE 2

Qualities and dielectric properties of selected piezoelectric materials.

| Material | Mechanical Q $Q_M$ | Electrical Q $Q_E$ | Constant stress dielectric, $\epsilon^T_{33}$, $\epsilon^T_{11}$ ($\epsilon_0$) | Constant Strain dielectric, $\epsilon^S_{33}$, $\epsilon^S_{11}$ ($\epsilon_0$) |
|---|---|---|---|---|
| PZT-4* | 500 | 250 | 1300, 1475 | 635, 730 |
| PZT-5H* | 65 | 50 | 3400, 3130 | 1470, 1700 |
| Single Crystal# | App. 50 | App. 50–200 | 5200, 3100 | 1000, 3000 |

Notation is standard IEEE notation for piezoelectricity. Material is transversely isotropic. Cut quoted by manufacturer is <100>.
*data according to Morgan Matroc, Inc. TP-226
data according to TRS Ceramics for PZN-4.5%PT, Inc. http://www.trsceramics.com In single crystal relaxor compositions, lower loss factors (higher mechanical Q's) are generally exhibited in the harder compositions, such as the PMN-PT series. The single crystal properties of Tables 1 and 2 are representative of a particular single crystal material, PZN-4.5% PT, cut in a nominal <100> direction and poled parallel and transverse to that cut. Data provided by TRS Ceramics show even higher dielectrics and coupling factors for PMN-33% PT single crystal material.

To date, typical transformers have been produced from hard polycrystalline piezoelectric compositions, because their extremely high mechanical Q's improve voltage gain. However, because of these materials' relatively low dielectric strengths, it is difficult to get energy into and out of the material. In contrast, we have found that single crystals are 7–10 times as compliant, but exhibit an equivalent directional modulus, and generally exhibit mechanical Q's of around 50. These transmission Q's are on par with soft polycrystalline compositions, and therefore, standing alone, would seem to imply inferior performance. However, it is much easier to get energy into the single crystal piezoelectric material, to couple it to mechanical energy and back to output electrical energy, and to extract it from our device.

In contrast to the polycrystalline ceramics, single crystal devices typically show slightly lower voltage gains but offer even higher current throughput capability (are matched by lower output electrical impedances), thus providing greater power density. Gain and current output are both functions of design, including geometry, poling, and other factors which will be apparent to one of ordinary skill in the art. Equivalent voltage gains to those of polycrystalline transformers can be achieved by the devices of the invention, but they will have different output impedances from similarly constructed prior art devices, which those of ordinary skill in the art will be able to accommodate with circuit designs. One design tailored to the use of our innovative transformer is described in the copending and commonly owned application of Masters, et al., "Tuned Power Ignition System."

FIG. 1 shows a piezoelectric transformer according to the invention. The illustrated transformer is of the Rosen type, but other known configurations of piezoelectric transformers, may also be used. (A wide variety of piezoelectric transformer configurations are known in the art. For example, transformer designs suitable for use with the invention are disclosed in U.S. Pat. Nos. 5,118,982; 5,229,680; 5,241,236; 5,278,471; 5,402,031; 5,424,602; 5,504,384; 5,675,208; 5,757,106; 5,814,922; 5,834,882; 5,894,185; 6,215,227; and 6,278,227, all of which are incorporated herein by reference). Single crystal relaxor ferroelectric piezoelectric element 10 is coupled to input electrodes 12 and output electrodes 16. The electrodes may be, for example, gold patches plated onto the ceramic piezoelectric element. The piezoelectric element is polarized in the two regions as shown by arrows.

The device of FIG. 1 is excited by electrical input at frequencies near the second axial resonance mode of the ceramic construction. Since the device is piezoelectric, this mechanical resonance mode is coupled to the electrical (and thermal) characteristics of the device and therefore has varying frequency with varying output electrical load. The use of the single crystal element allows lower impedance output loads to be used with a high power density. Typical prior art piezoelectric ceramic transformers are capable of generating a maximum around 300 W/in$^3$, while we have demonstrated that a single crystal transformer of a relaxor ferroelectric material can generate power densities as high as 1.8 kW/in$^3$.

Figure 2:
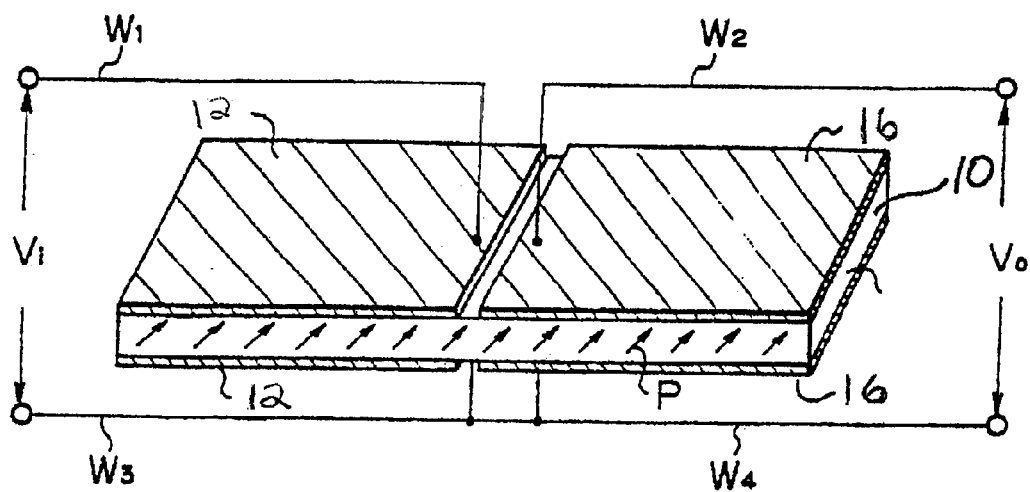
FIG. 2 shows an extensional transformer according to the invention.
Figure 3:
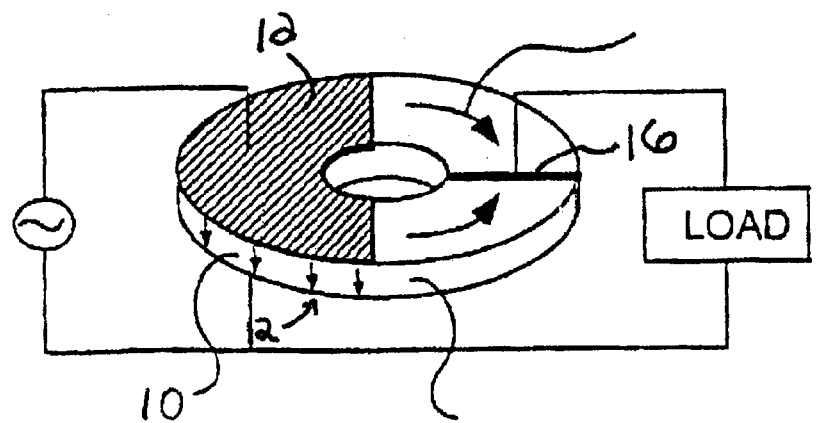
FIG. 3 shows an annular transformer according to the invention.
Figure 4:
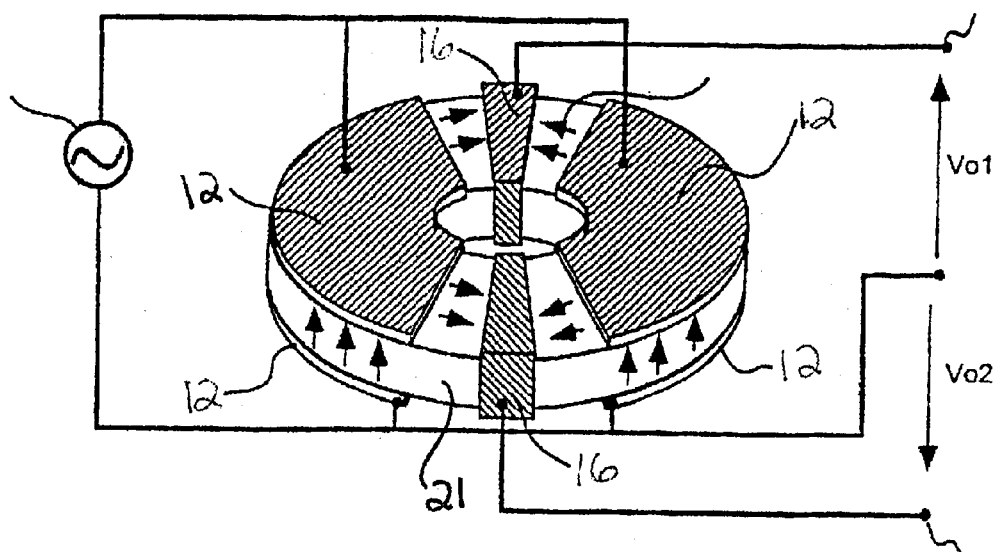
FIG. 4 shows a second annular transformer according to the invention.

FIGS. 2–4 show further suitable transformer configurations. In each case, a relaxor piezoelectric element 10 is coupled to input electrodes 12 and output electrodes 16, and polarized as indicated by arrows. Each of these transformer configurations will have different electrical and mechanical properties, and are suitable for different applications. The transformer shown in FIG. 2 operates in extensional mode, and has the advantage that the entire piezoelectric element is poled in a single direction. The transformer shown in FIG. 3 operates by expanding radially, and has a circular shape that may be advantageous in some situations. The transformer shown in FIG. 4 represents an improvement upon the general shape shown in FIG. 3, tending to produce a more balanced vibration, since the input electrodes are more symmetrically placed.

It has been proposed in U.S. Pat. No. 5,229,680 to Sato et al. to use a single crystal LiNbO$_3$ piezoelectric in a transformer. LiNbO$_3$ is not a relaxor material, and its single crystal exhibits an increased mechanical Q as compared to the polycrystalline material. Thus, the substitution of a single crystal for a polycrystal in a LiNbO$_3$ transformer follows the conventional wisdom of the art in attempting to increase Q in order to improve performance. Our invention, in contrast, uses a material that exhibits a lower Q, but nevertheless exhibits improved performance because of its greater coupling coefficients and dielectric constant.

Domain texturing and optimal crystallographic cuts can benefit the operation of transformers according to the invention much as they do in specific quartz and LiNbO$_3$ cuts for optimal thermal and acoustic performance. Measurement of the directional properties of relaxor ceramics is a topic of continuing research. Those of ordinary skill in the art will understand how to use published data on texture effects on mechanical Q and transmission directions to optimize particular transformer designs.

Precision cutting of piezoelectric ceramics to form complicated transformer geometries with particular crystallographic textures can be performed as described in commonly owned U.S. Pat. No. 6,337,465 to Masters et al., which is incorporated by reference herein.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A piezoelectric transformer, comprising:
   a single crystal relaxor ferroelectric piezoelectric element having a mechanical resonant frequency;
   input electrodes coupled to the piezoelectric element;
   output electrodes coupled to the piezoelectric element,
   wherein an input current delivered via the input electrodes acts to cause the piezoelectric element to vibrate near its resonant frequency, thereby producing a transformed output current at the output electrodes.

2. A piezoelectric transformer, comprising:
   a single crystal relaxor ferroelectric piezoelectric element having a mechanical resonant frequency, wherein the piezoelectric element comprises PZN-PT;
   input electrodes coupled to the piezoelectric element;
   output electrodes coupled to the piezoelectric element,
   wherein an input current delivered via the input electrodes acts to cause the piezoelectric element to vibrate near its resonant frequency, thereby producing a transformed output current at the output electrodes.

3. The piezoelectric transformer of claim 1, wherein the piezoelectric element comprises PMN-PT.

4. The piezoelectric transformer of claim 1, wherein the piezoelectric element vibrates in an extensional mode.

5. The piezoelectric transformer of claim 1, wherein the piezoelectric element vibrates in a plate bending mode.

6. The piezoelectric transformer of claim 1, wherein the piezoelectric element vibrates in a beam bending mode.

7. The piezoelectric transformer of claim 1, wherein the piezoelectric element vibrates in a thickness mode.

\* \* \* \* \*